United States Patent
Dede et al.

(10) Patent No.: US 10,453,777 B2
(45) Date of Patent: Oct. 22, 2019

(54) POWER ELECTRONICS ASSEMBLIES WITH CIO BONDING LAYERS AND DOUBLE SIDED COOLING, AND VEHICLES INCORPORATING THE SAME

(71) Applicant: Toyota Motor Engineering & Manufacturing North America, Inc., Erlanger, KY (US)

(72) Inventors: Ercan Mehmet Dede, Ann Arbor, MI (US); Shailesh N. Joshi, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 75 days.

(21) Appl. No.: 15/883,897

(22) Filed: Jan. 30, 2018

(65) Prior Publication Data

US 2019/0237388 A1 Aug. 1, 2019

(51) Int. Cl.
*H01L 23/00* (2006.01)
*H01L 23/473* (2006.01)
(Continued)

(52) U.S. Cl.
CPC .......... *H01L 23/473* (2013.01); *B81B 7/0006* (2013.01); *B81C 1/00269* (2013.01);
(Continued)

(58) Field of Classification Search
CPC ......... H01L 23/00; H01L 23/22; H01L 23/34; H01L 23/46; H01L 23/473; H01L 23/481;
(Continued)

(56) References Cited

U.S. PATENT DOCUMENTS 6,016,007 A * 1/2000 Sanger .................. H01L 23/473
257/706
6,397,450 B1 6/2002 Ozmat
(Continued)

OTHER PUBLICATIONS

Dusseault, Thomas J., "Inverse opals for fluid delivery in electronics cooling systems"; URL: https://nanoheat.stanford.edu/sites/default/files/publications/dusseault_final.pdf.
(Continued)

*Primary Examiner* — Mukundbhai G Patel
*Assistant Examiner* — Zhengfu J Feng
(74) *Attorney, Agent, or Firm* — Dinsmore & Shohl LLP

(57) ABSTRACT

A 2-in-1 power electronics assembly includes a frame with a lower dielectric layer, an upper dielectric layer spaced apart from the lower dielectric layer, and a sidewall disposed between and coupled to the lower dielectric layer and the upper dielectric layer. The lower dielectric layer includes a lower cooling fluid inlet and the upper dielectric layer includes an upper cooling fluid outlet. A first semiconductor device assembly and a second semiconductor device assembly are included and disposed within the frame. The first semiconductor device is disposed between a first lower metal inverse opal (MIO) layer and a first upper MIO layer, and the second semiconductor device is disposed between a second lower MIO layer and a second upper MIO layer. An internal cooling structure that includes the MIO layers provides double sided cooling for the first semiconductor device and the second semiconductor device.

20 Claims, 8 Drawing Sheets

(51) Int. Cl.
*H01L 23/373* (2006.01)
*H01L 23/48* (2006.01)
*B81C 3/00* (2006.01)
*H01L 21/50* (2006.01)
*F28F 13/00* (2006.01)
*B81B 7/00* (2006.01)
*B81C 1/00* (2006.01)
*H01L 23/522* (2006.01)
*H01L 23/22* (2006.01)
*H01L 23/34* (2006.01)
*H01L 23/46* (2006.01)

(52) U.S. Cl.
CPC ............ *B81C 3/001* (2013.01); *F28F 13/003* (2013.01); *H01L 21/50* (2013.01); *H01L 23/00* (2013.01); *H01L 23/22* (2013.01); *H01L 23/34* (2013.01); *H01L 23/3733* (2013.01); *H01L 23/3736* (2013.01); *H01L 23/46* (2013.01); *H01L 23/481* (2013.01); *H01L 23/5226* (2013.01)

(58) Field of Classification Search
CPC ............. H01L 23/3733; H01L 23/3736; H01L 23/5226; H01L 21/50; B81C 1/00269; B81C 3/001; B81B 7/0006; F28F 13/003
See application file for complete search history.

(56) References Cited

U.S. PATENT DOCUMENTS

| 9,257,365 | B2 | 2/2016 | Joshi | |
|---|---|---|---|---|
| 9,272,899 | B2 | 3/2016 | Kotlanka et al. | |
| 9,986,631 | B2* | 5/2018 | Rizza | H01L 23/24 |
| 2009/0146293 | A1* | 6/2009 | Olesen | H01L 23/473 |
| | | | | 257/714 |
| 2012/0257354 | A1* | 10/2012 | Dede | H01L 23/473 |
| | | | | 361/703 |
| 2012/0328789 | A1 | 12/2012 | Lu et al. | |
| 2013/0020719 | A1 | 1/2013 | Jung et al. | |
| 2014/0076522 | A1* | 3/2014 | Olesen | H05K 7/20309 |
| | | | | 165/104.21 |
| 2015/0115453 | A1* | 4/2015 | Kotlanka | H01L 21/50 |
| | | | | 257/770 |

OTHER PUBLICATIONS

Barako, Michael T. et al, "Thermal conduction in nanoporous copper inverse opal films", May 30, 2014, URL: http://ieeexplore.ieee.org/document/6892354/?part=1.

Dumé, Belle, "Heat conduction goes ballistic in opals", URL: http://nanotechweb.org/cws/article/tech/64569.

Zhang, Chi et al., "Characterization of the capillary performance of copper inverse opals", Jun. 3, 2016; URL: http://www.ieeexplore.ws/document/7517661/.

* cited by examiner

POWER ELECTRONICS ASSEMBLIES WITH CIO BONDING LAYERS AND DOUBLE SIDED COOLING, AND VEHICLES INCORPORATING THE SAME

TECHNICAL FIELD

The present specification generally relates to power electronics assemblies, and more particularly, power electronics assemblies having metal substrates with integral stress-relief features.

BACKGROUND

Power electronics devices are often utilized in high-power electrical applications, such as inverter systems for hybrid electric vehicles and electric vehicles. Such power electronics devices include power semiconductor devices such as power insulated-gate bipolar transistors (IGBTs) and power transistors thermally bonded to a metal substrate. With advances in battery technology and increases in electronics device packaging density, operating temperatures of power electronics devices have increased and are currently approaching 200° C. Heat sinking devices may be coupled to the power electronics devices to remove heat and lower the maximum operating temperature of a power semiconductor device. Cooling fluid may be used to receive heat generated by the power semiconductor device by convective thermal transfer, and remove such heat from the power semiconductor device. For example, a jet of cooling fluid may be directed such that it impinges a surface of the power semiconductor device. Another way to remove heat from a power semiconductor device is to couple the power semiconductor device to a finned heat sink made of a thermally conductive material, such as aluminum.

However, as power electronics devices are designed to operate at increased power levels thereby generating more heat due to the demands of newly developed electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Accordingly, a need exists for alternative power electronics assemblies and power electronics devices having internal cooling structures.

SUMMARY

In one embodiment, a 2-in-1 power electronics assembly includes a frame with a lower dielectric layer, an upper dielectric layer spaced apart from the lower dielectric layer, and a sidewall disposed between and coupled to the lower dielectric layer and the upper dielectric layer. The lower dielectric layer includes a lower cooling fluid inlet and the upper dielectric layer includes an upper cooling fluid outlet. A first semiconductor device assembly and a second semiconductor device assembly are included and disposed within the frame. The first semiconductor device is disposed between a first lower metal inverse opal (MIO) layer and a first upper MIO layer, and the second semiconductor device is disposed between a second lower MIO layer and a second upper MIO layer. A middle dielectric layer is positioned between the upper dielectric layer, the lower dielectric layer, the first semiconductor device assembly, and the second semiconductor device assembly. A lower fluid chamber may be disposed between the lower dielectric layer, the middle dielectric layer, the first semiconductor device assembly and the second semiconductor device assembly. An upper fluid chamber may be disposed between the upper dielectric layer, the middle dielectric chamber, the first semiconductor device assembly and the second semiconductor device assembly.

In embodiments, the lower dielectric layer includes a lower cooling fluid outlet and the upper dielectric layer includes an upper cooling fluid inlet. In such embodiments, a lower cooling fluid circuit includes the lower cooling fluid inlet, the second lower MIO layer, the lower fluid chamber, the first lower MIO layer and the lower cooling fluid outlet and is configured for cooling fluid to flow proximate to surfaces of the first and second semiconductor devices. Also, an upper cooling fluid circuit includes the upper cooling fluid inlet, the first upper MIO layer, the upper fluid chamber, the second upper MIO layer and the upper cooling fluid outlet and is configured for cooling fluid to flow proximate to surfaces of the first and second semiconductor devices.

The 2-in-1 power electronics assembly may include a positive electrode disposed between the upper dielectric layer and the first upper MIO layer, a negative electrode disposed between the upper dielectric layer and the second upper MIO layer, and an output electrode disposed between the lower dielectric layer, the first lower MIO layer and the second lower MIO layer. The positive electrode may be in electrical communication with the first semiconductor device through the first upper MIO layer, the negative electrode may be in electrical communication with the second semiconductor device through the second upper MIO layer, and the output electrode may be in electrical communication with the first semiconductor device and the second semiconductor device through the first bottom MIO layer and the second MIO bottom layer, respectively. In some embodiments, a first isolating MIO layer may be included and be spaced apart from the first lower MIO layer and disposed between the first semiconductor device and the lower dielectric layer. In such embodiments, a first gate electrode may be included and be disposed between the lower dielectric layer and the first isolating MIO layer such that the first gate electrode is electrically isolated from the output electrode and in electrical communication with the first semiconductor device through the first isolating MIO layer. Also, a second isolating MIO layer may be included and spaced apart from the second upper MIO layer and disposed between the second semiconductor device and the upper dielectric layer. A second gate electrode may be disposed between the upper dielectric layer and the second isolating MIO layer such that the second gate electrode is electrically isolated from the negative electrode and in electrical communication with the second semiconductor device through the second isolating MIO layer.

In some embodiments, a fluid path may extend through the middle dielectric layer between the lower fluid chamber and the upper fluid chamber. The fluid path may be in the form of an MIO column extending through the middle dielectric layer, or in the alternative, at least one metal through hole via extending through the middle dielectric layer. In such embodiments, the lower dielectric layer may include a first lower cooling fluid inlet and a second lower cooling fluid inlet, and the upper dielectric layer may include a first upper cooling fluid outlet and a second upper cooling fluid outlet. A cooling fluid circuit includes the first and second lower cooling fluid inlets, the first and second lower MIO layers, the fluid path extending through the middle dielectric layer, the first and second upper MIO layers, and the first and second upper cooling fluid outlets. Also, the cooling fluid circuit may include a first cooling fluid flow path of: first lower cooling fluid inlet—first lower MIO layer—lower fluid chamber—fluid path—first upper MIO layer—first upper cooling fluid outlet; and a second cooling fluid flow path of: second lower cooling fluid inlet—second lower MIO layer—fluid path—upper fluid chamber—second upper MIO layer—second upper cooling fluid outlet.

In another embodiment, a 2-in-1 power electronics assembly includes a lower dielectric layer with a lower cooling fluid inlet and a lower cooling fluid outlet, and an upper dielectric layer spaced apart from the lower dielectric layer and with an upper cooling fluid inlet and an upper cooling fluid outlet. A middle dielectric layer may be positioned between and spaced apart from the lower dielectric layer and the upper dielectric layer. A first semiconductor device assembly and a second semiconductor device assembly are included. The first semiconductor device assembly includes a first semiconductor device disposed between a first lower MIO layer and a first upper MIO layer and the second semiconductor device assembly includes a second semiconductor device disposed between a second lower MIO layer and a second upper MIO layer. A lower fluid chamber may be provided between the lower dielectric layer and the middle dielectric layer and an upper fluid chamber may be provided between the middle dielectric layer and the upper dielectric layer. The first semiconductor assembly and the second semiconductor device assembly may be disposed between the lower dielectric layer and the upper dielectric layer, and the middle dielectric layer may be positioned between the first semiconductor device assembly and the second semiconductor device assembly. The 2-in-1 power electronics assembly may include a lower cooling fluid circuit with a lower cooling fluid path of: lower cooling fluid inlet—second lower MIO layer—lower fluid chamber—first lower MIO layer—lower cooling fluid outlet, and an upper cooling fluid circuit with an upper cooling fluid path of: upper cooling fluid inlet—first upper MIO layer—upper fluid chamber—second upper MIO layer—upper cooling fluid outlet.

In embodiments, a positive electrode may be disposed between the upper dielectric layer and the first upper MIO layer, a negative electrode may be disposed between the upper dielectric layer and the second upper MIO layer, and an output electrode disposed may be between the lower dielectric layer, the first lower MIO layer and the second lower MIO layer. In such embodiments, the positive electrode is in electrical communication with the first semiconductor device through the first upper MIO layer, the negative electrode is in electrical communication with the second semiconductor device through the second upper MIO layer, and the output electrode is in electrical communication with the first semiconductor device and the second semiconductor device through the first bottom MIO layer and the second MIO bottom layer, respectively. A first isolating MIO layer may be included and be spaced apart from the first lower MIO layer, and a first gate electrode may be disposed between the lower dielectric layer and the first isolating MIO layer. Also, a second isolating MIO layer may be included and be spaced apart from the second upper MIO layer, and a second gate electrode may be disposed between the upper dielectric layer and the second isolating MIO layer.

In still another embodiment, a 2-in-1 power electronics assembly includes a lower dielectric layer with a first lower cooling fluid inlet and a second lower cooling fluid inlet, and an upper dielectric layer with a first upper cooling fluid outlet and a second cooling fluid outlet. A middle dielectric layer may be positioned between and spaced apart from the lower dielectric layer and the upper dielectric layer, and a fluid path may extend through the middle dielectric layer. A first semiconductor device assembly with a first semiconductor device disposed between a first lower MIO layer and a first upper MIO layer may be included. Also, a second semiconductor device assembly with a second semiconductor device disposed between a second lower MIO layer and a second upper MIO layer may be included. A lower fluid chamber may be provided between the lower dielectric layer and the middle dielectric layer, and an upper fluid chamber may be provided between the middle dielectric layer and the upper dielectric layer. The first semiconductor assembly and the second semiconductor device assembly are disposed between the lower dielectric layer and the upper dielectric layer and the middle dielectric layer is positioned between the first semiconductor device assembly and the second semiconductor device assembly. A first portion of a cooling fluid circuit may include a first fluid flow path of: first lower cooling fluid inlet—first lower MIO layer—lower fluid chamber—fluid path—first upper MIO layer—first upper cooling fluid outlet. Also, a second portion of the cooling fluid circuit may include a second fluid flow path of: second lower cooling fluid inlet—second lower MIO layer—fluid path—upper fluid chamber—second upper MIO layer—second upper cooling fluid outlet.

In some embodiments, a positive electrode may be disposed between the lower dielectric layer and the first lower MIO layer, a negative electrode may be disposed between the upper dielectric layer and the second upper MIO layer, a first output electrode may be disposed between the upper dielectric layer and the first upper MIO layer, and a second output electrode may be disposed between the lower dielectric layer and the second lower MIO layer. In such embodiments, the positive electrode is in electrical communication with the first semiconductor device through the first lower MIO layer, the negative electrode is in electrical communication with the second semiconductor device through the second upper MIO layer, the first output electrode is in electrical communication with the first semiconductor device through the first upper MIO layer, and the second output electrode is in electrical communication with the second semiconductor device through the second lower MIO layer. A first isolating MIO layer spaced apart from the first upper MIO layer and disposed between the first semiconductor device and the upper dielectric layer may be included. Also, a second isolating MIO layer spaced apart from the second upper MIO layer and disposed between the second semiconductor device and the upper dielectric layer may be included. A first gate electrode may be disposed between the upper dielectric layer and the first isolating MIO layer, and a second gate electrode may be included and disposed between the upper dielectric layer and the second isolating MIO layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

One non-limiting example of a 2-in-1 power electronics assembly with an internal cooling structure includes a pair of power semiconductor devices (semiconductor devices) disposed and mounted within a frame using a plurality of metal inverse opal (MIO) layers. As used herein, the phrase "2-in-1" refers to two separate semiconductor devices disposed within a frame. The frame includes a lower dielectric layer and an upper dielectric layer spaced apart from the lower dielectric layer. The lower dielectric layer includes at least one cooling fluid inlet and the upper dielectric layer includes at least one cooling fluid outlet. A middle dielectric layer is disposed between and spaced apart from the lower dielectric layer and the upper dielectric layer such that a lower fluid chamber is provided between the lower dielectric layer and the middle dielectric layer and an upper fluid chamber is provided between the middle dielectric layer and the upper dielectric layer. A first semiconductor device assembly and a second semiconductor device assembly are disposed within and coupled to the frame. The first semiconductor device assembly includes a first semiconductor device disposed between and bonded to a first pair of MIO layers and the second semiconductor device assembly includes a second semiconductor device disposed between and bonded to a second pair of MIO layers. Double sided cooling of the first and second semiconductor devices is provided via cooling fluid flowing through the at least one cooling fluid inlet, the first and second pairs of MIO layers and the at least one cooling fluid outlet. Various embodiments of 2-in-1 power electronics assemblies with internal cooling structures will be described in more detail herein.

Figure 1A:
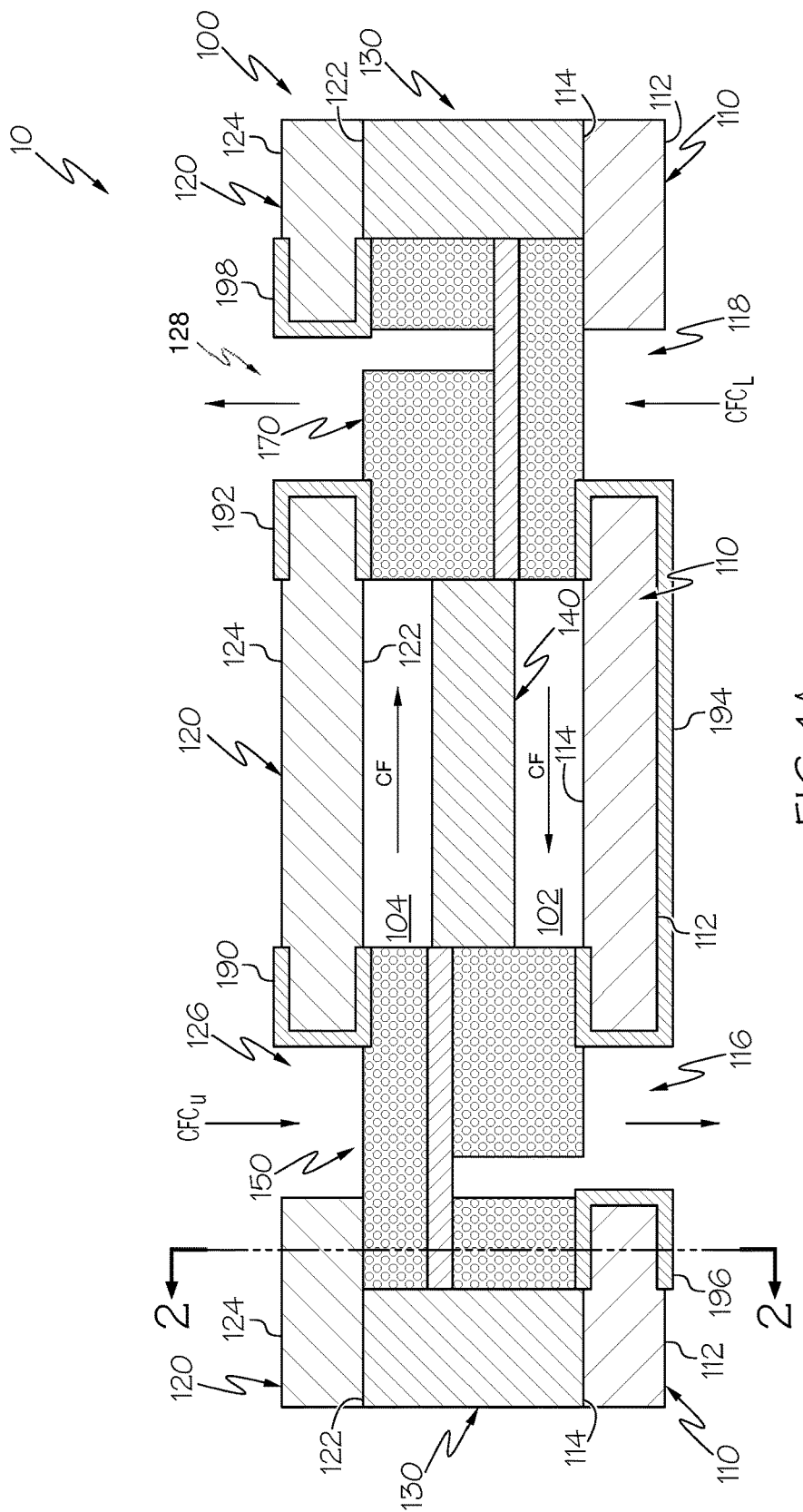
FIG. 1A schematically depicts a side view of a 2-in-1 power electronics assembly with an internal cooling structure according to one or more embodiments shown and described herein.
Figure 1B:
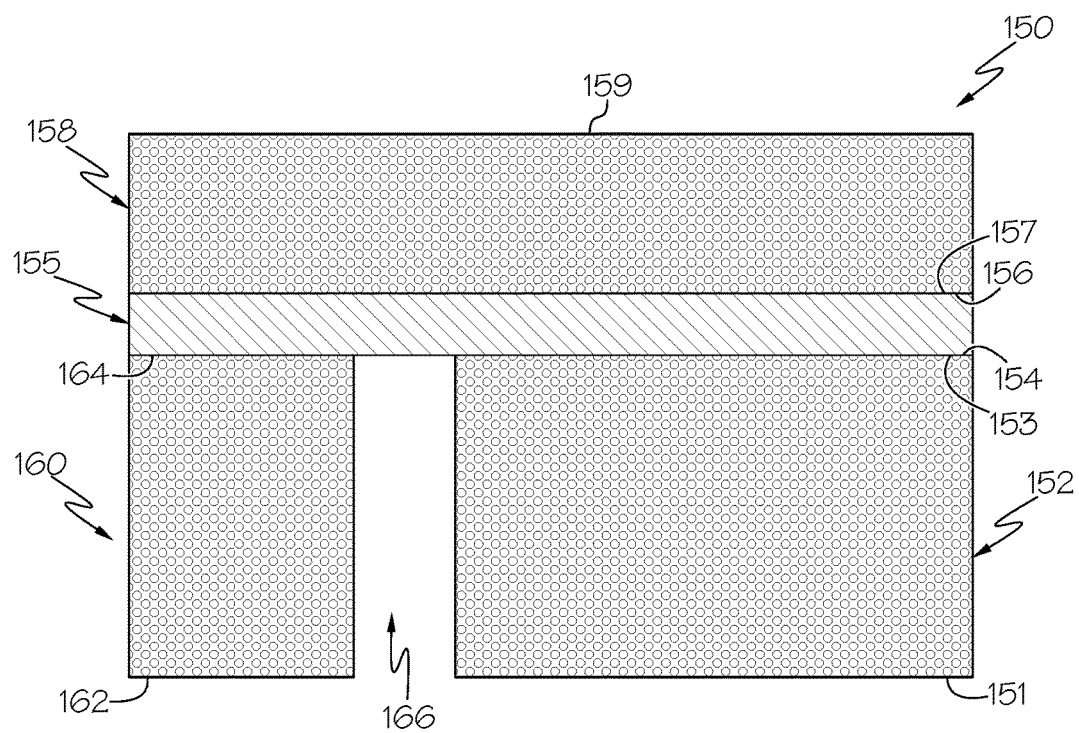
FIG. 1B schematically depicts an isolated view of a first semiconductor device assembly in FIG. 1A according to one or more embodiments shown and described herein.
Figure 1C:
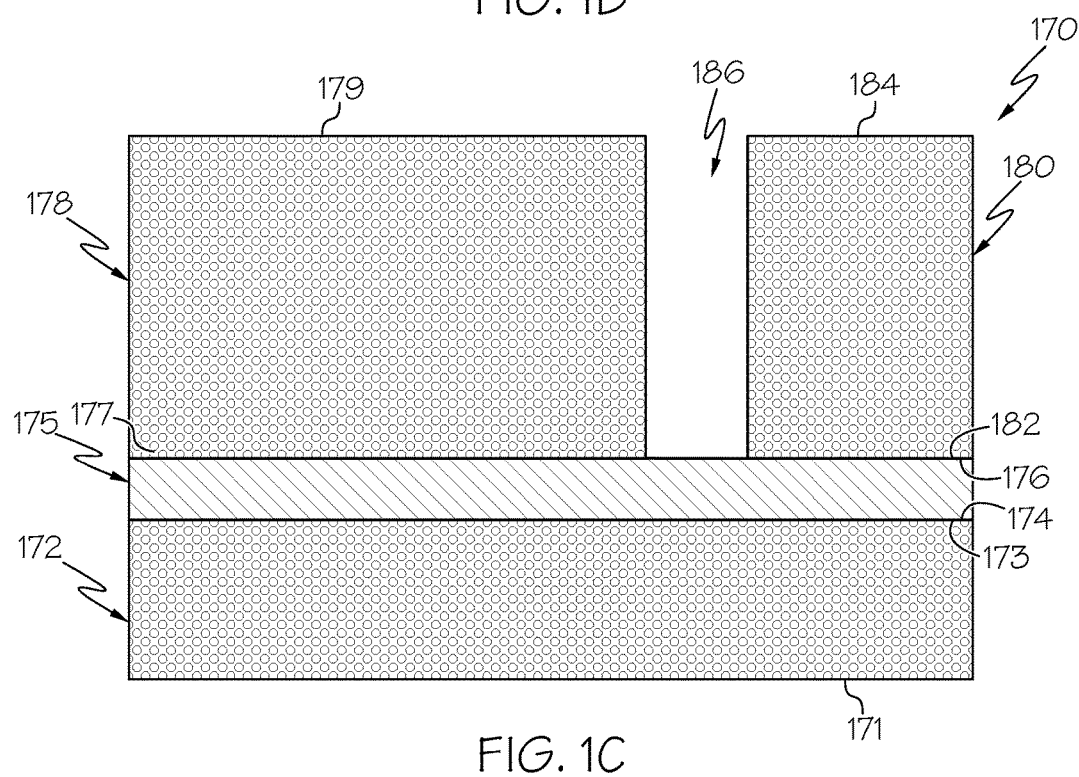
FIG. 1C schematically depicts an isolated view of a second semiconductor device assembly in FIG. 1A according to one or more embodiments shown and described herein.

Referring initially to FIGS. 1A-1C, one non-limiting example of a 2-in-1 power electronics assembly 10 with an internal cooling structure is illustrated. The 2-in-1 power electronics assembly 10 generally comprises a frame 100, a first semiconductor device assembly 150, and a second semiconductor device assembly 170. The frame 100 includes a lower (−Y direction) dielectric layer 110 and an upper (+Y direction) dielectric layer 120. The lower dielectric layer 110 and the upper dielectric layer 120 may be coupled together with at least one sidewall 130 to form the frame 100. The lower dielectric layer 110 may include a lower cooling fluid inlet 118 and a lower cooling fluid outlet 116, and the upper dielectric layer 120 may include an upper cooling fluid inlet 126 and an upper cooling fluid outlet 128. The first semiconductor device assembly 150 may include a first lower MIO layer 152 (FIG. 1B), a first semiconductor device 155, and a first upper MIO layer 158. The second semiconductor device assembly 170 may include a second lower MIO layer 172 (FIG. 1C), a second semiconductor device 175, and a second upper MIO layer 178. A middle dielectric layer 140 (FIG. 1A) may be included and be positioned with the frame 100 spaced apart from and between the lower dielectric layer 110 and the upper dielectric layer 120. A lower fluid chamber 102 is provided between the first semiconductor device assembly 150, the second semiconductor device assembly 170, the lower dielectric layer 110, and the middle dielectric layer 140. Also, an upper fluid chamber 104 is provided between the first semiconductor device assembly 150, the second semiconductor device assembly 170, the middle dielectric layer 140, and the upper dielectric layer 120.

The thicknesses of the lower dielectric layer 110, the upper dielectric layer 120, the middle dielectric layer 140 (collectively referred to herein as "dielectric layers 110, 120, 140"), the first and second lower MIO layers 152, 172, the first and second semiconductor devices 155, 175, and the first and second upper MIO layers 158, 178 may depend on the intended use of the power electronics assembly 10. In one embodiment, the dielectric layers 110, 120, 140 each have a thickness within the range of about 1.0 millimeter (mm) and about 4.0 mm, the first and second lower MIO layers 152, 172, and the first and second upper MIO layers 158, 178 each have a thickness within the range of about 1.0 mm to about 5.0 mm, and the first and second semiconductor devices 155, 175 each have a thickness within the range of about 0.1 mm to about 0.3 mm. For example and without limitation, the dielectric layers 110, 120, 140 may each have a thickness of about 2.0 mm, the first lower MIO layer 152 and the second upper MIO layer 178 may each have a thickness of about 3.0 mm, the first upper MIO layer 158 and the second lower MIO layer 172 may each have a thickness of about 1.0 mm, and the first and second semiconductor devices 155, 175 may each have a thickness of about 0.2 mm. It should be understood that other thicknesses may be utilized.

The dielectric layers 110, 120, 140 may be formed from dielectric materials such as silicon (Si), glass, and the like, and the frame 100 may be formed by bonding the lower dielectric layer 110 and the upper dielectric layer 120 to the at least one sidewall 130. Non-limiting examples of bonding techniques used to bond the lower dielectric layer 110 and the upper dielectric layer 120 to the at least one sidewall 130 include fusion bonding, eutectic bonding, electroplate bonding, and the like. For example, in embodiments, the lower dielectric layer 110, the upper dielectric layer 120 and the sidewall 130 are formed from Si and the frame 100 is formed using Si—Si fusion bonding, Si-gold (Au) eutectic bonding, Si-Metal electroplate bonding, and the like.

The first and second lower MIO layers 152, 172 and the first and second upper MIO layers 158, 178 may be formed from a metallic material that can be electrolytically or electrolessly deposited such as copper (Cu), aluminum (Al), nickel (Ni), Cu alloys, Al alloys, Ni alloys, and the like. The first and second semiconductor devices 155, 175 may be formed from a wide band gap semiconductor material suitable for the manufacture or production of power semiconductor devices such as power IGBTs and power transistors. In embodiments, the first and second semiconductor devices 155, 175 may be formed from wide band gap semiconductor materials including without limitation silicon carbide (SiC), silicon dioxide ($SiO_2$), aluminum nitride (AlN), gallium nitride (GaN), gallium oxide ($Ga_2O_3$), boron nitride (BN), diamond, and the like. In embodiments, the MIO layers 158, 178 and the semiconductor devices 155, 175 may comprise a coating, e.g., nickel (Ni) plating, to assist in the bonding of the semiconductor devices 155, 175 to the MIO layers 158, 178.

Referring specifically to FIGS. 1B-1C, the first lower MIO layer 152 of the first semiconductor device assembly 150 has a first surface 151 (e.g., a lower surface) and a second surface 153 (e.g., an upper surface), the first upper MIO layer 158 has a first surface 157 and a second surface 159, and the first semiconductor device 155 has a first surface 154 and a second surface 156. The first surface 154 of the first semiconductor device 155 may be bonded to the second surface 153 of the first lower MIO layer 152 and the second surface 156 of the first semiconductor device 155 may be bonded to the first surface 157 of the first upper MIO layer 158. In some embodiments, a first isolating MIO layer 160 with a first surface 162 and a second surface 164 may be included and be spaced apart from the first lower MIO layer 152. For example, an air gap 166 may be between the first isolating MIO layer 160 and the first lower MIO layer 152. Also, the second surface 164 of the first isolating MIO layer 160 may be bonded to the first surface 154 of the first semiconductor device 155.

The second lower MIO layer 172 of the second semiconductor device assembly 170 has a first surface 171 and a second surface 173, the second upper MIO layer 178 has a first surface 177 and a second surface 179, and the second semiconductor device 175 has a first surface 174 and a second surface 176. The first surface 174 of the second semiconductor device 175 may be bonded to the second surface 173 of the second lower MIO layer 172 and the second surface 176 of the second semiconductor device 175 may be bonded to the first surface 177 of the second upper MIO layer 178. In some embodiments, a second isolating MIO layer 180 with a first surface 182 and a second surface 184 may be included and may be spaced apart from the second upper MIO layer 178. For example, an air gap 186 may be between the second isolating MIO layer 180 and the second upper MIO layer 178. Also, the first surface 182 of the second isolating MIO layer 180 may be bonded to the second surface 176 of the second semiconductor device 175.

Referring now back to FIG. 1A, the first semiconductor device assembly 150 is disposed between and may be bonded to the lower dielectric layer 110 and the upper dielectric layer 120. Particularly, the first surface 151 (FIG. 1B) of the first lower MIO layer 152 may be bonded to the second surface 114 of the lower dielectric layer 110 and the second surface 159 of the first upper MIO layer 158 may be bonded to a first surface 122 of the upper dielectric layer 120. In embodiments where the first isolating layer 160 is included, the first surface 162 of the first isolating layer 160 may be bonded to the second surface 114 of the lower dielectric layer 110.

The second semiconductor device assembly 170 is disposed between and may be bonded to the lower dielectric layer 110 and the upper dielectric layer 120. Particularly, the first surface 171 (FIG. 1C) of the second lower MIO layer 172 may be bonded to the second surface 114 of the lower dielectric layer 110 and the second surface 179 of the second upper MIO layer 178 may be bonded to the first surface 122 of the upper dielectric layer 120. In embodiments where the second isolating MIO layer 180 is included, the second surface 184 of the second isolating MIO layer 180 may be bonded to the first surface 122 of the upper dielectric layer 120.

In embodiments, the second semiconductor device assembly 170 is spaced apart from the first semiconductor device assembly 150. In such embodiments, the middle dielectric layer 140 may be disposed between the first semiconductor device assembly 150 and the second semiconductor device assembly 170 as schematically depicted in FIG. 1A.

Still referring to FIG. 1A, in embodiments, a positive electrode 190 may be disposed between the upper dielectric layer 120 and the first semiconductor device assembly 150, a negative electrode 192 may be disposed between the upper dielectric layer 120 and the second semiconductor device assembly 170, and an output electrode 194 may be disposed between the lower dielectric layer 110 and the first and second semiconductor device assemblies 150, 170. For example, the positive electrode 190 may be disposed between the first surface 122 of the upper dielectric layer 120 and the second surface 159 (FIG. 1B) of the first upper MIO layer 158. In such an example, it should be understood that the positive electrode 190 may be in electrical communication (contact) with the first semiconductor device 155 through the first upper MIO layer 158. Also, the negative electrode 192 may be disposed between the first surface 122 of the upper dielectric layer 120 and the second surface 179 (FIG. 1B) of the second upper MIO layer 178, and the negative electrode 192 may be in electrical communication with the second semiconductor device 175 through the second upper MIO layer 178. The output electrode 194 may be disposed between the second surface 114 of the lower dielectric layer 110 and the first surface 151 (FIG. 1B) of the first lower MIO layer 152 and disposed between the first surface 171 (FIG. 1C) of the second lower MIO layer 172. It should be understood that the output electrode 194 may be in electrical communication with the first semiconductor device 155 through the first lower MIO layer 152 and in electrical communication with the second semiconductor device 175 through the second lower MIO layer 172.

In some embodiments, the positive electrode 190 and/or the negative electrode 192 may be in direct contact with the first surface 122 of the upper dielectric layer 120 and the output electrode 194 may be in direct contact with the second surface 114 of the lower dielectric layer 110. In other embodiments, the positive electrode 190 and/or the negative electrode 192 may not be in direct contact with the first surface 122 of the upper dielectric layer 120 and/or the output electrode 194 may not be in direct contact with the second surface 114 of the lower dielectric layer 110. For example, one or more bonding layers (not shown) may be disposed between the positive electrode 190 and/or the negative electrode 192 and the first surface 122 of the upper dielectric layer 120 and/or one or more bonding layers may be disposed between the output electrode 194 and the second surface 114 of the lower dielectric layer 110. It should be understood that the positive electrode 190 and/or the negative electrode 192 may extend continuously from the first surface 122 of the upper dielectric layer 120 up to (+Y direction) and across a second surface 124 of the upper dielectric layer 120 as depicted in FIG. 1A. That is, electrodes described herein may extend continuously from between a dielectric layer and an adjacent MIO layer to an oppositely disposed surface of the dielectric layer such that electrical communication with the electrodes from an outer surface of the frame 100 is provided.

In addition to the positive electrode 190, the negative electrode 192, and the output electrode 194, a first gate electrode 196 may be included and disposed between the lower dielectric layer 110 and the first semiconductor device assembly 150 and a second gate electrode 198 may be disposed between the upper dielectric layer 120 and the second semiconductor device assembly 170. Particularly, the first gate electrode 196 may be disposed between the second surface 114 of the lower dielectric layer 110 and the first surface 162 (FIG. 1B) of the first isolating MIO layer 160. Accordingly, the first gate electrode 196 may be electrically isolated from the output electrode 194 and in electrical communication with the first semiconductor device 155 through the first isolating MIO layer 160. Also, the second gate electrode 198 may be disposed between the first surface 122 of the upper dielectric layer 120 and the second surface 184 (FIG. 1C) of the second isolating MIO layer 180. Accordingly, the second gate electrode 198 may be electrically isolated from the negative electrode 192 and in electrical communication with the second semiconductor device 175 through the second isolating MIO layer 180.

The 2-in-1 power electronics assembly 10 comprises an internal cooling structure that includes a lower cooling fluid circuit $CFC_L$ and an upper cooling fluid circuit $CFC_U$. In one non-limiting example the lower cooling fluid circuit $CFC_L$ provides cooling to the first surfaces 154, 174 of the first and second semiconductor devices 155, 175, respectively, and the upper cooling fluid circuit $CFC_U$ provides cooling to the second surfaces 156, 176 of the first and second semiconductor devices 155, 175, respectively. Particularly, the lower cooling fluid circuit $CFC_L$ comprises the lower cooling fluid inlet 118, the second lower MIO layer 172 (FIG. 1C), the lower fluid chamber 102, the first lower MIO layer 152 (FIG. 1B) and the lower cooling fluid outlet 116. Accordingly, the cooling fluid circuit $CFC_L$ is configured for cooling fluid 'CF' to flow through the 2-in-1 power electronics assembly 10 via a cooling path of: lower cooling fluid inlet 118—second lower MIO layer 172—lower fluid chamber 102—first lower MIO layer 152—lower cooling fluid outlet 116. The cooling fluid CF flowing through the lower cooling fluid circuit $CFC_L$ provides cooling to both of the semiconductor devices 155, 175 by flowing proximate to the first surfaces 154, 174 (FIGS. 1B-1C) of the semiconductor devices 155, 175, respectively, and removing heat generated by the semiconductor devices 155, 175. That is, heat generated by and transferred from the semiconductor devices 155, 175 to the first and second lower MIO layers 152, 172, respectively, is transferred to and removed by the cooling fluid CF flowing through the lower cooling fluid circuit $CFC_L$. As used herein, the term "proximate to" refers to a distance within 1.0 mm of an adjacent semiconductor device surface, for example, within 0.5 mm or within 0.2 mm of an adjacent semiconductor device surface. The upper cooling fluid circuit $CFC_U$ comprises the upper cooling fluid inlet 126, the first upper MIO layer 158 (FIG. 1B), the upper fluid chamber 104, the second upper MIO layer 178 (FIG. 1C) and the upper cooling fluid outlet 128. Accordingly, the upper cooling fluid circuit $CFC_U$ is configured for the cooling fluid CF to flow through the 2-in-1 power electronics assembly 10 via a cooling path of: upper cooling fluid inlet 126—first upper MIO layer 158—upper fluid chamber 104—second upper MIO layer 178—upper cooling fluid outlet 128. The cooling fluid CF flowing through the upper cooling fluid circuit $CFC_U$ provides cooling to both of the semiconductor devices 155, 175 by flowing proximate to the second surfaces 156, 176 (FIGS. 1B-1C) of the semiconductor devices 155, 175, respectively, and removing heat generated by the semiconductor devices 155, 175. That is, heat generated by and transferred from the semiconductor devices 155, 175 to the first and second upper MIO layers 158, 178, respectively, is transferred to and removed by cooling fluid CF flowing through the upper cooling fluid circuit $CFC_U$.

Figure 2A:
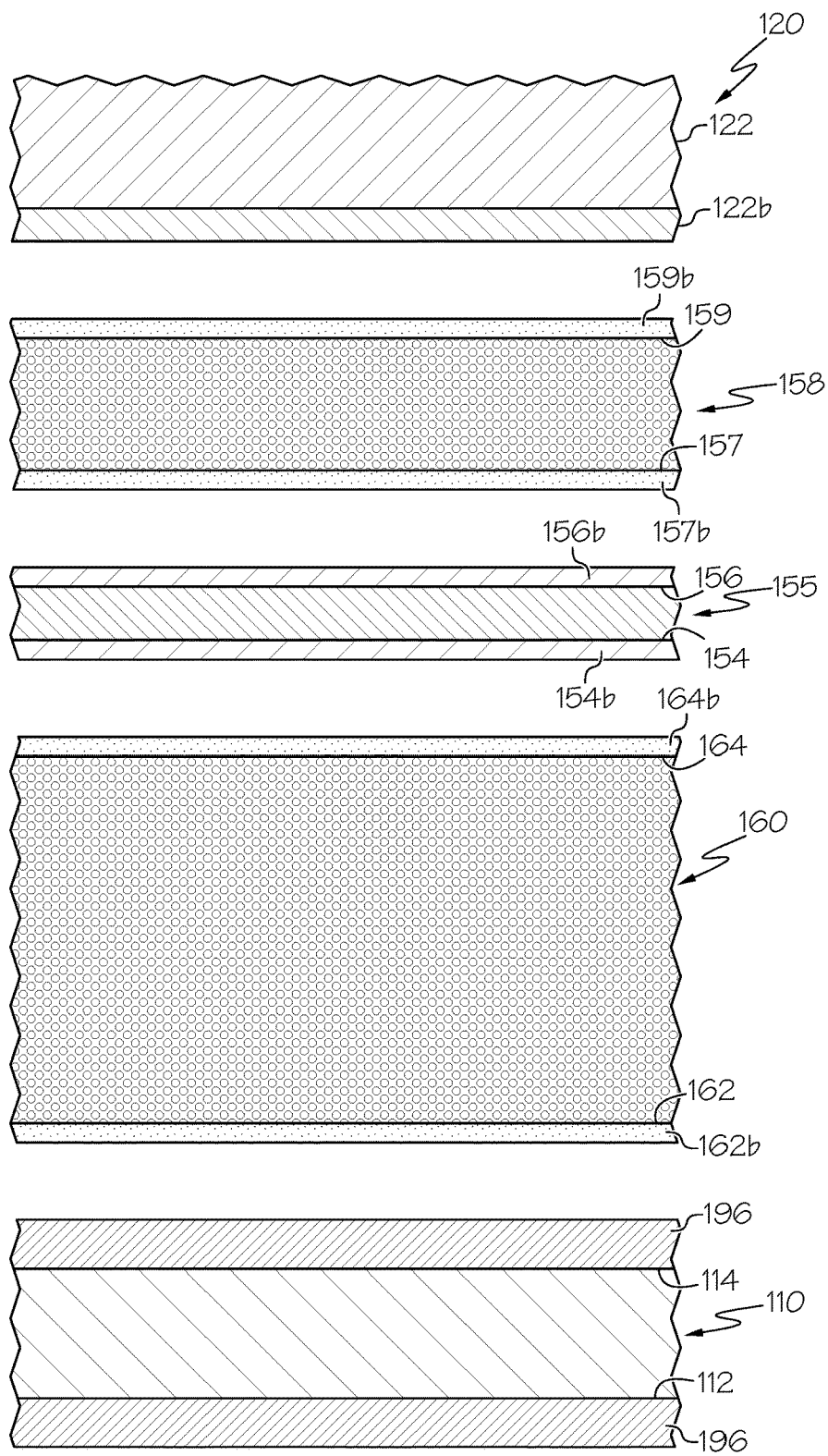
FIG. 2A schematically depicts an exploded view of section 2-2 in FIG. 1.
Figure 2B:
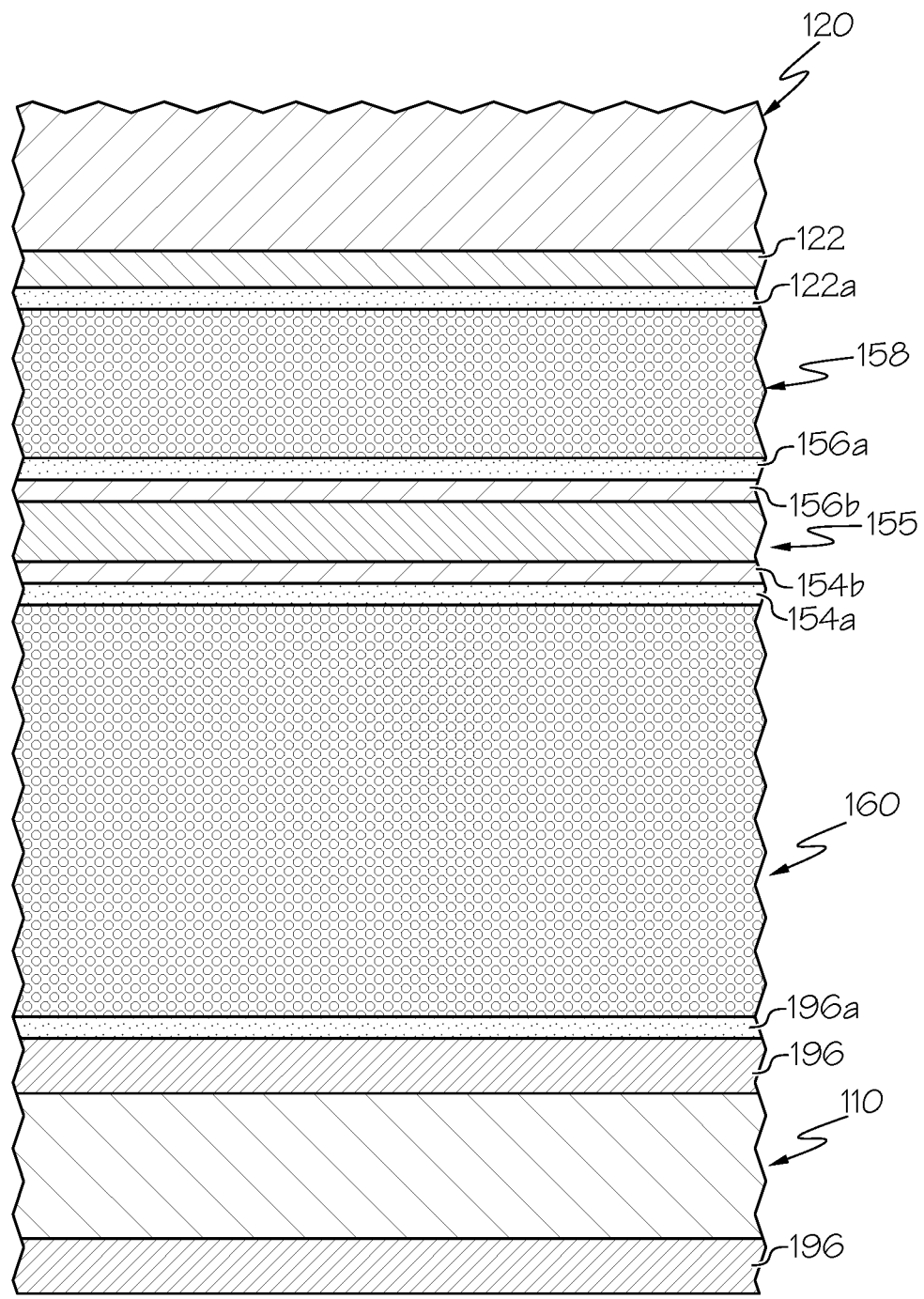
FIG. 2B schematically depicts a view of section 2-2 in FIG. 1.

Referring now to FIGS. 2A-2B, a non-limiting example of the bonding between layers of the 2-in-1 power electronics assembly 10 is schematically depicted. Particularly, an exploded view of section 2-2 shown in FIG. 1A before layers of section 2-2 are bonded together is schematically depicted in FIG. 2A and a view of section 2-2 after the layers are bonded together is schematically depicted in FIG. 2B. In the non-limiting example schematically depicted in FIGS. 2A-2B the layers may be bonded together via transient liquid phase (TLP) bonding and the lower dielectric layer 110 and the first semiconductor device 155 are TLP bonded together by the first isolating layer 160 and the first semiconductor device 155 and the upper dielectric layer 120 are TLP bonded together by the first upper MIO layer 158.

Referring specifically to FIG. 2A, before TLP bonding a low melting point (LMP) lower bonding layer 162b is disposed on the first surface 162 of the first isolating MIO layer 160 and a LMP upper bonding layer 164b disposed on the second surface 164; a lower bonding layer 154b is disposed on the first surface 154 of the first semiconductor device 155 and an upper bonding layer 156b is disposed on the second surface 156; a LMP lower bonding layer 157b is disposed on the first surface 157 of the first upper MIO layer 158 and a LMP upper bonding layer 159b is disposed on the second surface 159; and a bonding layer 122b is disposed on the first surface 122 of the upper dielectric layer 120. In embodiments, the pair of LMP bonding layers 162b, 164b and the pair of LMP bonding layers 157b, 159b (collectively referred to herein as "LMP bonding layers 162b, 164b, 157b, 159b") each have a melting point that is less than a melting point of the first isolating MIO layer 160, the first upper MIO layer 158, the first gate electrode 196, the pair of bonding layers 154b, 156b, and the bonding layer 122b. Particularly, the LMP bonding layers 162b, 164b, 157b, 159b each have a melting point that is less than a TLP sintering temperature used to TLP bond the first semiconductor device assembly 150 to the lower dielectric layer 110 and the upper dielectric layer 120. As a non-limiting example, the TLP sintering temperature is between about 280° C. and about 350° C., the LMP bonding layers 162b, 164b, 157b, 159b have a melting point less than about 280° C., and the first isolating MIO layer 160, the first upper MIO layer 158, the first gate electrode 196, the pair of bonding layers 154b, 156b, and the bonding layer 122b each have a melting point greater than 350° C. For example, the LMP bonding layers 162b, 164b 157b, 159b may be formed from tin (Sn) with a melting point of about 232° C., whereas the first isolating MIO layer 160, the first upper MIO layer 158, the first gate electrode 196, the pair of bonding layers 154b, 156b, and the bonding layer 122b may be formed from materials such as Cu, Ni, Al, silver (Ag), zinc (Zn) and magnesium (Mg) with a melting point of about 1085° C., 1455° C., 660° C., 962° C., 420° C.

and 650° C., respectively. Accordingly, the LMP bonding layers 162b, 164b, 157b, 159b at least partially melt, and the first isolating MIO layer 160, the first upper MIO layer 158, the first gate electrode 196, the pair of bonding layers 154b, 156b, and the bonding layer 122b do not melt during TLP sintering together the layers of the 2-in-1 power electronics assembly 10.

The first upper MIO layer 158, and other MIO layers described herein, have a plurality of hollow spheres and a predefined porosity. In embodiments, a permeability and thermal conductivity for the first upper MIO layer 158, and other MIO layers described herein, is a function of the porosity, i.e., the amount and/or size of the porosity, of the first upper MIO layer 158. As used herein, the term "permeability" refers to the ability of an MIO layer to allow a liquid or gas flow through the MIO layer. The MIO layers described herein may be formed by depositing metal within a sacrificial template of packed microspheres and then dissolving the microspheres to leave a skeletal network of metal with a periodic arrangement of interconnected hollow spheres which may or may not be etched to increase the porosity and interconnection of the hollow spheres. The skeletal network of metal has a large surface area and the amount of porosity of an MIO layer can be varied by changing the size of the sacrificial microspheres. Also, the size of the microspheres and thus the size of the hollow spheres can be varied as a function of thickness (Y direction) of an MIO layer such that a graded porosity, i.e., graded hollow sphere diameter, as a function of thickness is provided. Accordingly, the permeability and thermal conductivity of the MIO layers described herein can be varied and controlled to provide a desired cooling fluid flow rate within the MIO layers and a desired heat removal rate from semiconductor devices in a 2-in-1 power electronics assembly.

In addition to a predefined porosity providing a desired permeability for an MIO layer, a stiffness for an MIO layer is a function of the predefined porosity. As used herein, the term stiffness refers to the elastic modulus (also known as Young's modulus) of a material, i.e., a measure of a material's resistance to being deformed elastically when a force is applied to the material. Similar to the permeability and thermal conductivity of an MIO layer, the stiffness of MIO layers described herein can be varied by the varying size of the microspheres and thus the size of the hollow spheres as a function of thickness (Y direction) of the MIO layer. Accordingly, a graded stiffness as a function of MIO layer thickness (Y direction) may be provided and controlled to accommodate thermal stress for a given semiconductor device—frame combination.

Generally, the MIO layers described herein comprise flat thin layers and bonding layers described herein comprise flat thin films. As non-limiting examples, the thicknesses of the first isolating MIO layer 160 and the first upper MIO layer 158 may be between about 25 micrometers (μm) and about 1000 μm. In embodiments, the first isolating MIO layer 160 has a thickness between about 100 μm and about 200 μm and the first upper MIO layer 158 has a thickness between about 25 μm and about 100 μm. Also, the thickness of each of the LMP bonding layers 162b, 164b, 157b, 159b may each be between 1 μm and 20 μm. In embodiments, the LMP bonding layers 162b, 164b, 157b, 159b each have a thickness between about 2 μm and about 15 μm.

The electrodes and the bonding layers described herein may be formed using conventional multilayer thin film forming techniques. Non-limiting examples of thin film forming techniques used to form the electrodes and bonding layers include chemical vapor deposition (CVD) of the electrodes and/or bonding layers onto a surface, physical vapor depositing (PVD) the electrodes and/or bonding layers onto a surface, electrolytically depositing the electrodes and/or bonding layers onto a surface, electroless depositing the electrodes and/or bonding layers onto a surface, and the like.

Referring now to FIG. 2B, the first gate electrode 196, the first isolating MIO layer 160, the first upper MIO layer 158, the pair of bonding layers 154b, 156b, and the bonding layer 122b remain as in FIG. 2A. That is, the first gate electrode 196, the first isolating MIO layer 160, the first upper MIO layer 158, the pair of bonding layers 154b, 156b, and the bonding layer 122b do not melt during the TLP bonding process and generally remain the same thickness as before the TLP bonding process. In contrast, the LMP bonding layers 162b, 164b, 157b, 159b at least partially melt, diffuse into the adjacent first gate electrode 196 and bonding layers 154b, 156b, 122b, respectively, and form TLP bond layers 196a, 154a, 156a, 122a, respectively. Although TLP bond layers 196a, 154a, 156a, 122a depicted in FIG. 2B have consumed the LMP bonding layers 162b, 164b, 157b, 159b, respectively, in embodiments the TLP bond layers 196a, 154a, 156a, and/or 122a may not totally consume the LMP bonding layers 162b, 164b, 157b, 159b, respectively, i.e., a thin layer of the LMP bonding layers 162b, 164b, 157b, 159b may be present after the first gate electrode 196, the first isolating MIO layer 160, the first semiconductor device 155, the first upper MIO layer 158, and the upper dielectric layer 120 are TLP bonded together. In other embodiments, one or more of the TLP bond layers 196a, 154a, 156a, 122a may comprise no layers, i.e., all of the LMP bonding layers 162b, 164b, 157b, and/or 159b diffuse into the first gate electrode 196, the first isolating MIO layer 160, the first semiconductor device 155, the first upper MIO layer 158, and/or the upper dielectric layer 120, respectively, thereby resulting in a clearly defined TLP bond layers 196a, 154a, 156a, and/or 122a not being present.

In embodiments, the first gate electrode 196, the first isolating MIO layer 160, and the first upper MIO layer 158 are formed from Cu. That is, the first gate electrode 196 is a CU electrode, and the first isolating MIO layer 160 and the first upper MIO layer 158 are copper inverse opal (CIO) layers. In such embodiments, the LMP bonding layers 162b, 164b, 157b, 159b may be formed from Sn, the bonding layers 154b, 156b, 122b may be formed from Cu or Ni, and the TLP bond layers 196a, 154a, 156a, 122a comprise an intermetallic layer of Cu and Sn. In some embodiments, the TLP bond layers 196a, 154a, 156a, 122a comprise an intermetallic layer of Cu, Ni and Sn. For example and without limitation, the TLP bond layers 196a, 154a, 156a, 122a may include the intermetallic $Cu_6Sn_5$, the intermetallic $(Cu, Ni)_6Sn_5$, the intermetallic $Cu_3Sn$ or a combination of the intermetallics $Cu_6Sn_5$, $(Cu, Ni)_6Sn_5$, and/or $Cu_3Sn$. It should be understood that the LMP bonding layers 162b, 164b, 157b, 159b formed from Sn at least partially melt at the TLP sintering temperature and then isothermally solidify during the formation of the Cu—Sn intermetallic(s) since $Cu_6Sn_5$ starts to melt at 415° C. and $Cu_3Sn$ starts to melt at about 767° C. That is, a melting temperature of the TLP bond layers 196a, 154a, 156a, 122a is greater than a melting temperature of the pair of LMP bonding layers 162b, 164b, 157b, 159b, respectively.

While FIGS. 2A-2B schematically depict TLP bonding of the lower dielectric layer 110, the first isolating MIO layer 160, the first semiconductor device 155, the first upper MIO layer 158 and the upper dielectric layer 120, it should be understood that other bonding techniques may be used to couple together the various layers of the 2-in-1 power electronics assembly 10. Non-limiting bonding techniques include soldering, brazing, fusion bonding, eutectic bonding, sintering, and the like. For example, soldering may be used to couple together the various layers of the 2-in-1 power electronics assemblies since the internal cooling structures may lower the operating temperatures of the 2-in-1 power electronics assemblies such that TLP bonding and TLP bonds are not required.

Figure 3A:
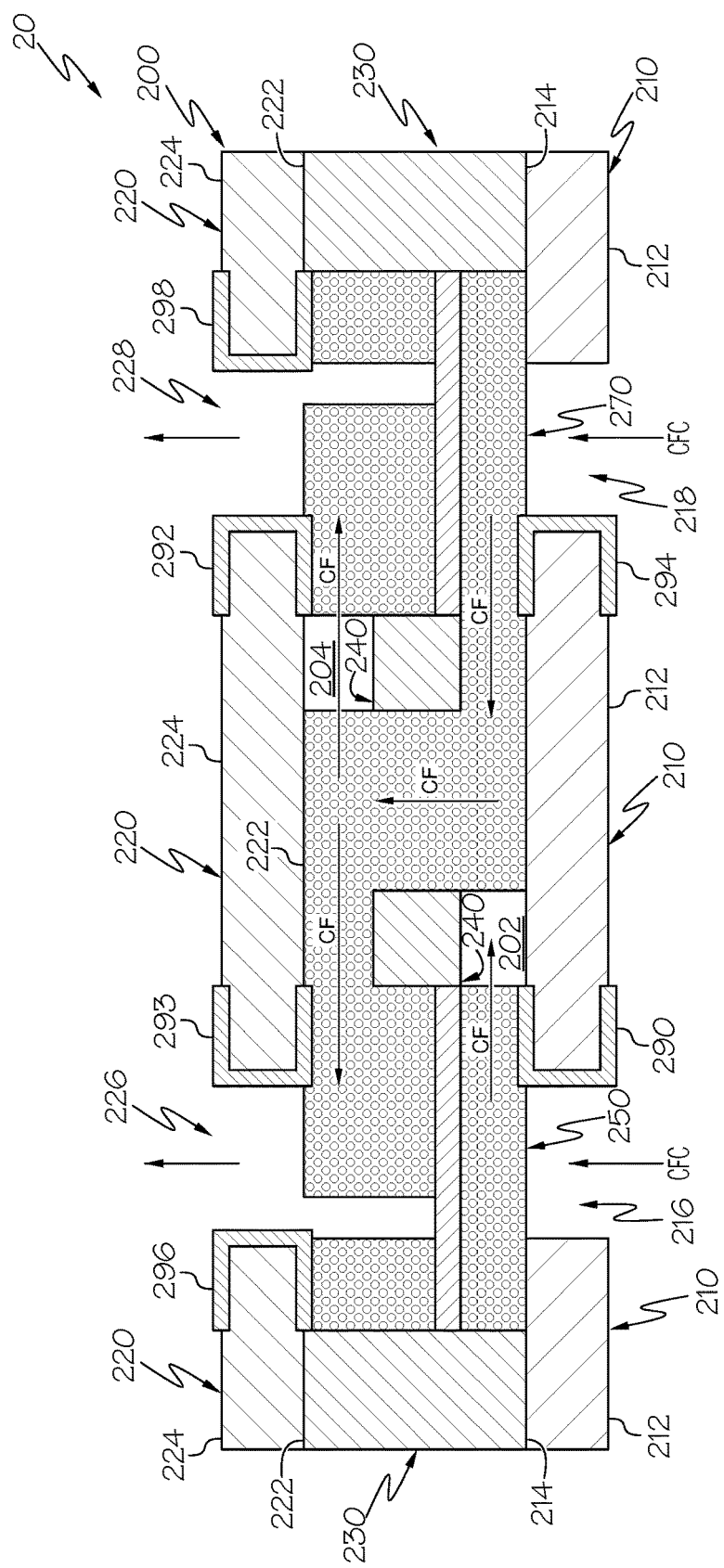
FIG. 3A schematically depicts a side view of a 2-in-1 power electronics assembly with an internal cooling structure according to one or more embodiments shown and described herein.
Figure 3B:
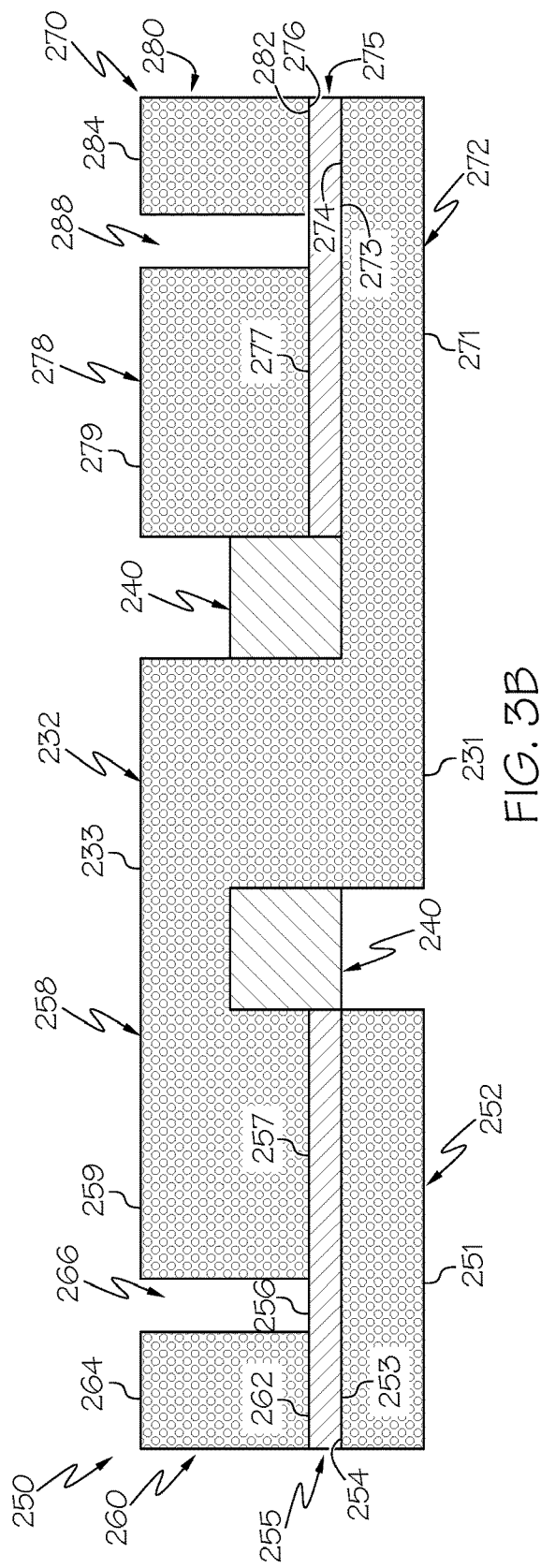
FIG. 3B schematically depicts an isolated view of a first semiconductor device assembly in FIG. 3A according to one or more embodiments shown and described herein.
Figure 3C:
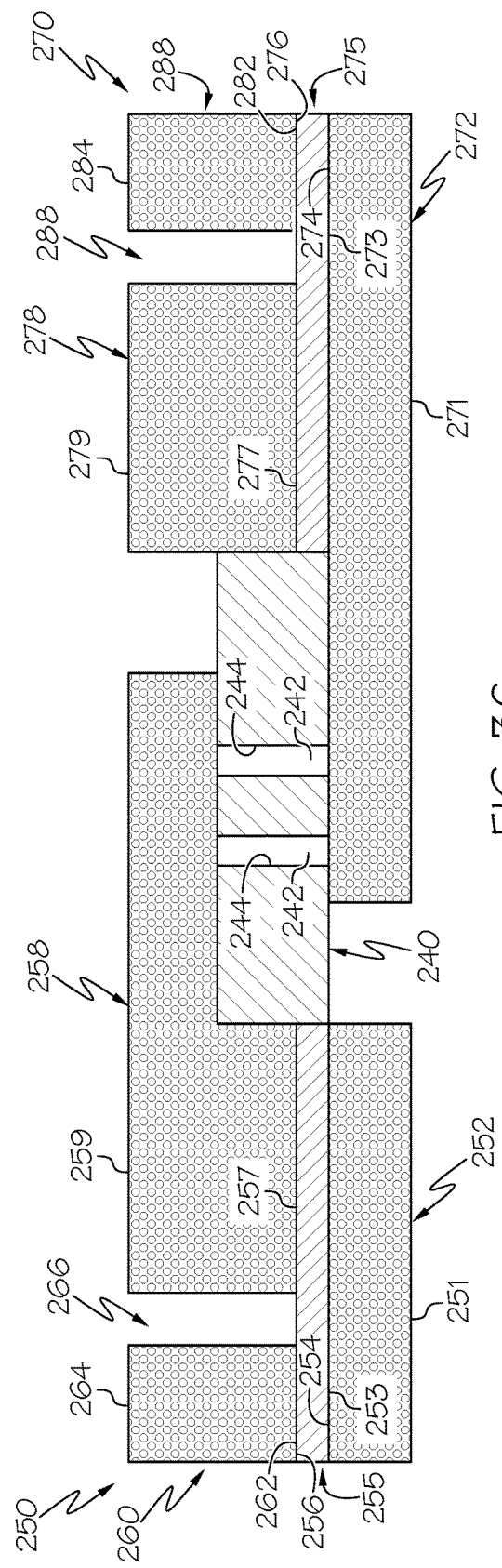
FIG. 3C schematically depicts an isolated view of a second semiconductor device assembly in FIG. 3A according to one or more embodiments shown and described herein.

Referring now to FIGS. 3A-3C, another non-limiting example of a 2-in-1 power electronics assembly 20 with an internal cooling structure is illustrated. The 2-in-1 power electronics assembly 20 generally comprises a frame 200, a first semiconductor device assembly 250, and a second semiconductor device assembly 270. The frame 200 includes a lower (−Y direction) dielectric layer 210 and an upper (+Y direction) dielectric layer 220. The lower dielectric layer 210 and the upper dielectric layer 220 may be coupled together with at least one sidewall 230 to form the frame 200. The lower dielectric layer 210 may include a first lower cooling fluid inlet 216 and a second lower cooling fluid inlet 218, and the upper dielectric layer 220 may include a first upper cooling fluid outlet 226 and a second upper cooling fluid outlet 228. Referring specifically to FIGS. 3B-3C, the first semiconductor device assembly 250 may include a first lower MIO layer 252, a first semiconductor device 255, and a first upper MIO layer 258. The second semiconductor device assembly 270 may include a second lower MIO layer 272, a second semiconductor device 275, and a second upper MIO layer 278. A middle dielectric layer 240 may be included and be positioned with the frame 200 spaced apart from and between the lower dielectric layer 210 and the upper dielectric layer 220. A lower fluid chamber 202 (FIG. 3A) is provided between the first semiconductor device assembly 250, the second semiconductor device assembly 270, the lower dielectric layer 210, and the middle dielectric layer 240. Also, an upper fluid chamber 204 (FIG. 3A) is provided between the first semiconductor device assembly 250, the second semiconductor device assembly 270, the middle dielectric layer 240, and the upper dielectric layer 220.

The thicknesses of the lower dielectric layer 210, the upper dielectric layer 220, the middle dielectric layer 240 (collectively referred to herein as "dielectric layers 210, 220, 240"), the first and second lower MIO layers 252, 272, the first and second semiconductor devices 255, 275, and the first and second upper MIO layers 258, 278 may depend on the intended use of the power electronics assembly 20. In one embodiment, the dielectric layers 210, 220, 240 each have a thickness within the range of about 1.0 mm and about 4.0 mm, the first and second lower MIO layers 252, 272, and the first and second upper MIO layers 258, 278 each have a thickness within the range of about 1.0 mm to about 5.0 mm, and the first and second semiconductor devices 255, 275 each have a thickness within the range of about 0.1 mm to about 0.3 mm. For example and without limitation, the dielectric layers 210, 220, 240 may each have a thickness of about 2.0 mm, the first lower MIO layer 252 and the second upper MIO layer 278 may each have a thickness of about 3.0 mm, the first upper MIO layer 258 and the second lower MIO layer 272 may each have a thickness of about 1.0 mm, and the first and second semiconductor devices 255, 275 may each have a thickness of about 0.2 mm. It should be understood that other thicknesses may be utilized.

The dielectric layers 210, 220, 240 may be formed from dielectric materials such as silicon (Si), glass, and the like, and the frame 200 may be formed by the lower dielectric layer 210 and the upper dielectric layer 220 bonded to the at least one sidewall 230. The first and second lower MIO layers 252, 272 and the first and second upper MIO layers 258, 278 may be formed from a metallic material that can be electrolytically or electrolessly deposited such as copper (Cu), aluminum (Al), nickel (Ni), Cu alloys, Al alloys, Ni alloys, and the like. The first and second semiconductor devices 255, 275 may be formed from a wide band gap semiconductor material suitable for the manufacture or production of power semiconductor devices such as power IGBTs and power transistors. In embodiments, the first and second semiconductor devices 255, 275 may be formed from wide band gap semiconductor materials including without limitation silicon carbide (SiC), silicon dioxide ($SiO_2$), aluminum nitride (AlN), gallium nitride (GaN), gallium oxide ($Ga_2O_3$), boron nitride (BN), diamond, and the like. In embodiments, the dielectric layers 210, 220, 240, and the first and second semiconductor devices 255, 275 may comprise a coating, e.g., nickel (Ni) plating, to assist in the bonding of the dielectric layers 210, 220, 240, and the first and second semiconductor devices 255, 275 to the first and second lower MIO layers 252, 272 and the first and second upper MIO layers 258, 278.

Still referring to FIGS. 3B-3C, the first lower MIO layer 252 of the first semiconductor device assembly 250 (FIG. 3B) has a first surface 251 and a second surface 253, the first upper MIO layer 258 has a first surface 257 and a second surface 259, and the first semiconductor device 255 has a first surface 254 and a second surface 256. The first surface 254 of the first semiconductor device 255 may be bonded to the second surface 253 of the first lower MIO layer 252 and the second surface 256 of the first semiconductor device 255 may be bonded to the first surface 257 of the first upper MIO layer 258. In some embodiments, a first isolating MIO layer 260 with a first surface 262 and a second surface 264 is included and may be included and may be spaced apart from the first upper MIO layer 258. For example, an air gap 266 may be between the first isolating MIO layer 260 and the first upper MIO layer 258. Also, the first surface 262 of the first isolating MIO layer 260 may be bonded to the second surface 256 of the first semiconductor device 255.

The second lower MIO layer 272 of the second semiconductor device assembly 270 (FIG. 3C) has a first surface 271 and a second surface 273, the second upper MIO layer 278 has a first surface 277 and a second surface 279, and the second semiconductor device 275 has a first surface 274 and a second surface 276. The first surface 274 of the second semiconductor device 275 may be bonded to the second surface 273 of the second lower MIO layer 272 and the second surface 276 may be bonded to the first surface 277 of the second upper MIO layer 278. In some embodiments, a second isolating MIO layer 280 with a first surface 282 and a second surface 284 is included and may be spaced apart from the second upper MIO layer 278. For example, an air gap 288 may be between the second isolating MIO layer 280 and the second upper MIO layer 278. Also, the first surface 282 of the second isolating MIO layer 280 may be bonded to the second surface 276 of the second semiconductor device 275.

The first semiconductor device assembly 250 is disposed between and may be bonded to the lower dielectric layer 210 and the upper dielectric layer 220. Particularly, the first surface 251 (FIG. 3B) of the first lower MIO layer 252 may be bonded to the second surface 214 of the lower dielectric layer 210 and the second surface 259 of the first upper MIO layer 258 may be bonded to the first surface 222 of the upper dielectric layer 220. In embodiments where the first isolating MIO layer 260 is included, the second surface 264 of the first isolating MIO layer 260 may be bonded to the first surface 222 of the upper dielectric layer 220.

The second semiconductor device assembly 270 is disposed between and may be bonded to the lower dielectric layer 210 and the upper dielectric layer 220. Particularly, the first surface 271 (FIG. 3C) of the second lower MIO layer 272 may be bonded to the second surface 214 of the lower dielectric layer 210 and the second surface 279 of the second upper MIO layer 278 may be bonded to the first surface 222 of the upper dielectric layer 220. In embodiments where the second isolating MIO layer 280 is included, the second surface 284 of the second isolating MIO layer 280 may be bonded to the first surface 222 of the upper dielectric layer 220. In embodiments, the second semiconductor device assembly 270 is spaced apart from the first semiconductor device assembly 250. In such embodiments, the middle dielectric layer 240 may be disposed between the first semiconductor device assembly 250 and the second semiconductor device assembly 270 as schematically depicted in FIG. 3A.

A fluid path extending through the middle dielectric layer 240 between the second lower MIO layer 272 and the first upper MIO layer 258 is provided. In some embodiments, the fluid path is provided by an MIO column 232 extending through the middle dielectric layer 240 as schematically depicted in FIG. 3B. In such embodiments, the MIO column 232 may extend from the second lower MIO layer 272 up through (+Y direction) the middle dielectric layer 240 to the first upper MIO layer 258 such that the MIO column 232 may be in fluid communication with the second lower MIO layer 272 and the first upper MIO layer 258. The MIO column 232 may be formed as a single MIO component with the second lower MIO layer 272 and the first upper MIO layer 258. In the alternative, the MIO column 232 may be formed as a separate MIO component from the second lower MIO layer 272 and/or the first upper MIO layer 258 so long as fluid and electrical communication between the MIO column 232, the second lower MIO layer 272 and the first upper MIO layer 258 is provided. In embodiments where the MIO column 232 is formed as a separate column, the MIO column includes a first surface 231 that may be bonded to the second surface 214 of the lower dielectric layer 210 and a second surface 233 that may be bonded to the first surface 222 of the upper dielectric layer 220.

In other embodiments, the fluid path is provided by at least one metal through hole via 242 extending through the middle dielectric layer 240 as schematically depicted in FIG. 3C. In such embodiments, the at least one metal through hole via 242 may extend from the second lower MIO layer 272 up through (+Y direction) the middle dielectric layer 240 to the first upper MIO layer 258. In such embodiments, the at least one metal through via 242 may be in fluid and electrical communication with the second lower MIO layer 272 and the first upper MIO layer 258. Also, the at least one metal through hole via 242 includes an electrically conductive inner surface 244 such that the second lower MIO layer 272 is in electrical communication with the first upper MIO layer 258 via the at least one metal through hole via 242. Non-limiting examples of materials used to form the electrically conductive inner surface 244 include Cu, Ag, Au, Al, alloys thereof, and the like.

Referring back to FIG. 3A, in embodiments, a positive electrode 290 may be disposed between the lower dielectric layer 210 and the first semiconductor device assembly 250 and a negative electrode 292 may be disposed between the upper dielectric layer 220 and the second semiconductor device assembly 270. Particularly, the positive electrode 290 may be disposed between the second surface 214 of the lower dielectric layer 210 and the first surface 251 (FIG. 3B) of the first lower MIO layer 252, and the positive electrode 290 may be in electrical communication with the first semiconductor device 255 through the first lower MIO layer 252. The negative electrode 292 may be disposed between the first surface 222 of the upper dielectric layer 220 and the second surface 279 (FIG. 3C) of the second upper MIO layer 278, and the negative electrode 292 may be in electrical communication with the second semiconductor device 275 through the second upper MIO layer 278.

A first output electrode 293 may be disposed between the upper dielectric layer 220 and the first semiconductor device assembly 250 and a second output electrode 294 may be disposed between the lower dielectric layer 210 and the second semiconductor device assembly 270. Particularly, the first output electrode 293 may be disposed between the first surface 222 of the upper dielectric layer 220 and the second surface 259 of the first upper MIO layer 258 and the first output electrode 293 may be in electrical communication with the first semiconductor device 255 through the first upper MIO layer 258. The first output electrode 293 may also be in electrical communication with the second semiconductor device 275 through the first upper MIO layer 258, the MIO column 232 (FIG. 3B) or the at least one metal through via 242 (FIG. 3C), and the second lower MIO layer 272. The second output electrode 294 may be disposed between the second surface 214 of the lower dielectric layer 210 and the first surface 271 of the second lower MIO layer 272. The second output electrode 294 may be in electrical communication with the second semiconductor device 275 through the second lower MIO layer 272. The second output electrode 294 may also be in electrical communication with the first semiconductor device 255 through the second lower MIO layer 272, MIO column 232 (FIG. 3B) or at least one metal through via 242 (FIG. 3C), and the first upper MIO layer 258.

In some embodiments, the positive electrode 290 and the second output electrode 294 may be in direct contact with the second surface 214 of the lower dielectric layer 210, and the negative electrode 292 and the first output electrode 293 may be in direct contact with the first surface 222 of the upper dielectric layer 220. In other embodiments, the positive electrode 290 and the second output electrode 294 may not be in direct contact with the second surface 214 of the lower dielectric layer 210, and the negative electrode 292 and the first output electrode 293 may not be in direct contact with the first surface 222 of the upper dielectric layer 220. For example, one or more bonding layers (not shown) may be disposed between the positive electrode 290 and/or the second output electrode 294 and the second surface 214 of the lower dielectric layer 210, and one or more bonding layers (not shown) may be disposed between the negative electrode 292 and/or the first output electrode 293 and the first surface 222 of the upper dielectric layer 220.

A first gate electrode 296 and a second gate electrode 298 may be included with the first gate electrode 296 disposed between the upper dielectric layer 220 and the first isolating MIO layer 260 and the second gate electrode 298 disposed between the upper dielectric layer 220 and the second isolating MIO layer 280. Particularly, the first gate electrode 296 may be disposed between the first surface 222 of the upper dielectric layer 220 and the second surface 264 of the first isolating MIO layer 260, and the first gate electrode 296 may be electrically isolated from the first output electrode 293 and in electrical communication with the first semiconductor device 255 through the first isolating MIO layer 260. The second gate electrode 298 may be disposed between the first surface 222 of the upper dielectric layer 220 and the second surface 284 of the second isolating MIO layer 280, and the second gate electrode 298 may be electrically isolated from the negative electrode 292 and in electrical communication with the second semiconductor device 275 through the second isolating MIO layer 280.

Though not shown in the figures, it should be understood that the layers of the 2-in-1 power electronics assembly 20 may include TLP bonding layers and be TLP bonded together as schematically depicted above with reference to FIGS. 2A-2B. In the alternative, or in addition to, two or more of the layers of the 2-in-1 power electronics assembly 20 may be bonded together using other known bonding techniques including without limitation soldering, brazing, sintering, and the like.

Still referring to FIG. 3A, the 2-in-1 power electronics assembly 20 comprises a cooling fluid circuit with two lower cooling fluid inlets and two upper cooling fluid outlets. In one non-limiting example the cooling fluid circuit provides cooling to the first surfaces 254, 274 of the first and second semiconductor devices 255, 275, respectively, and to the second surfaces 256, 276 of the first and second semiconductor devices 255, 275, respectively. Particularly, the cooling fluid circuit comprises the lower cooling fluid inlets 216, 218, the first and second lower MIO layers 252, 272, the lower fluid chamber 202, the MIO column 232 (FIG. 3B) or the at least one metal through hole via 242 (FIG. 3C), the first and second upper MIO layers 258, 278, the upper fluid chamber 204, and the upper cooling fluid outlets 226, 228. Accordingly, a first portion of cooling fluid CF flows through the cooling fluid circuit via a cooling fluid path of: first lower cooling fluid inlet 216—first lower MIO layer 252—lower fluid chamber 202—MIO column 232 (FIG. 3B) or metal through via 242 (FIG. 3C)—first upper MIO layer 258—first upper cooling fluid outlet 226. In the alternative, or in addition to, a first portion of cooling fluid CF flows through the cooling fluid circuit via a cooling fluid path of: first lower cooling fluid inlet 216—first lower MIO layer 252—lower fluid chamber 202—MIO column 232 (FIG. 3B) or metal through via 242 (FIG. 3C)—upper fluid chamber 204—second upper MIO layer 278—second upper cooling fluid outlet 228. Also, a second portion of cooling fluid CF flows through the cooling fluid circuit via a cooling fluid path of: second lower cooling fluid inlet 218—second lower MIO layer 272—MIO column 232 (FIG. 3B) or metal through via 242 (FIG. 3C)—upper fluid chamber 204—second upper MIO layer 278—second upper cooling fluid outlet 228. In the alternative, or in addition to, a second portion of cooling fluid CF flows through the cooling fluid circuit via a cooling fluid path of: second lower cooling fluid inlet 218—second lower MIO layer 272—MIO column 232 (FIG. 3B) or metal through via 242 (FIG. 3C)—first upper MIO layer 258—first upper cooling fluid outlet 226.

The cooling fluid CF flowing through the cooling fluid circuit provides cooling to both of the semiconductor devices 255, 275 by flowing proximate to the first surfaces 254, 274 and the second surfaces 256, 276 and removing heat generated by the semiconductor devices 155, 175. That is, heat generated by and transferred from the semiconductor devices 155, 175 is transferred to and removed by the cooling fluid CF flowing through the cooling fluid circuit.

Figure 4:
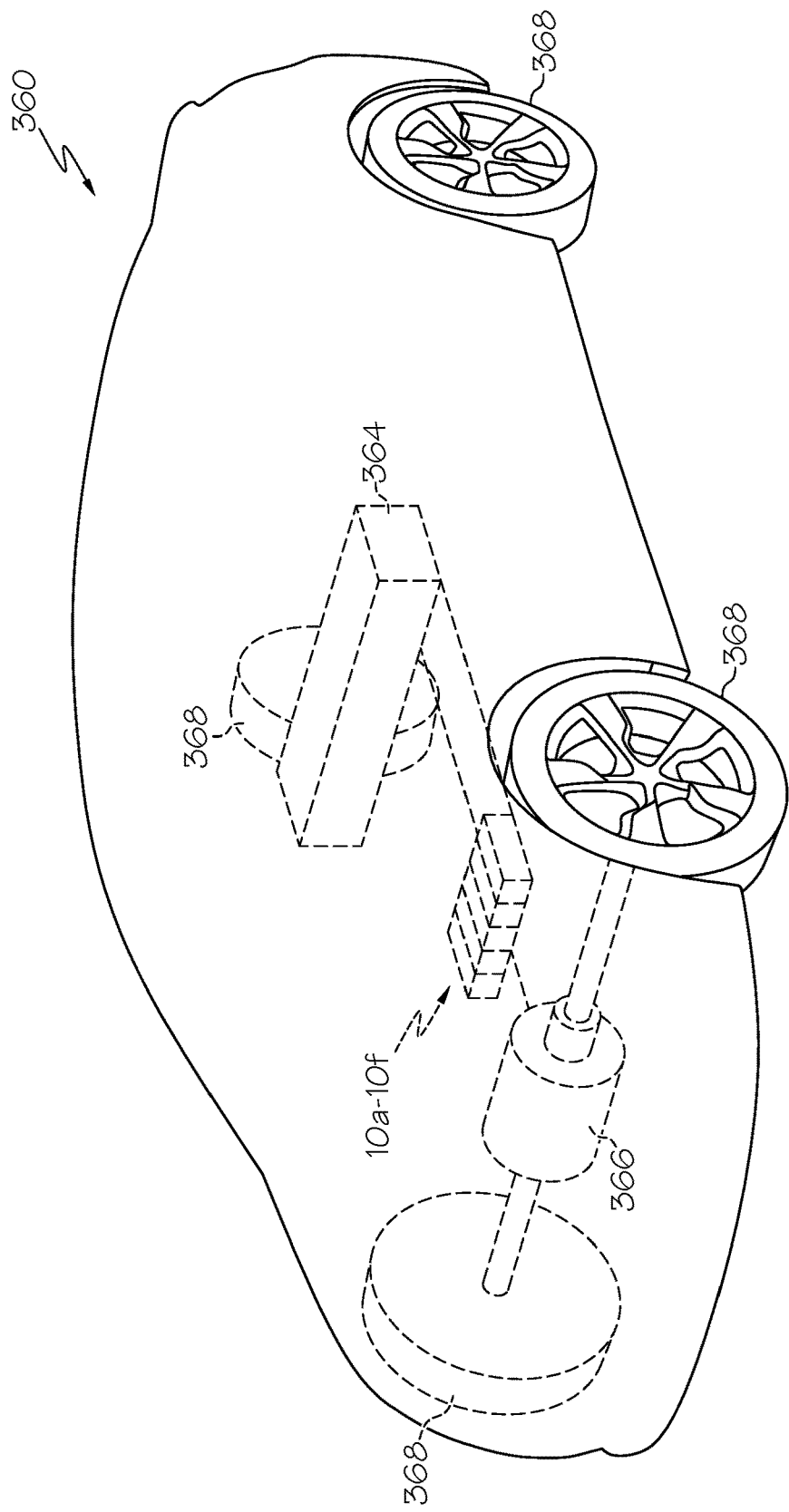
FIG. 4 schematically depicts a vehicle having a plurality of power electronics assemblies according to one or more embodiments shown and described herein.

The power electronics assemblies described herein may be incorporated into an inverter circuit or system that converts direct current electrical power into alternating current electrical power and vice versa depending on the particular application. For example, in a hybrid electric vehicle application as illustrated in FIG. 4, several power electronics assemblies 10a-10f may be electrically coupled together to form a drive circuit that converts direct current electrical power provided by a bank of batteries 364 into alternating electrical power that is used to drive an electric motor 366 coupled to the wheels 368 of a vehicle 360 to propel the vehicle 360 using electric power. The power electronics assemblies 10a-10f used in the drive circuit may also be used to convert alternating current electrical power resulting from use of the electric motor 366 and regenerative braking back into direct current electrical power for storage in the bank of batteries 364.

Power semiconductor devices utilized in such vehicular applications may generate a significant amount of heat during operation, which require cooling of the semiconductor devices. The internal cooling structures described and illustrated herein utilize MIO bonding layers to cool the semiconductor devices while also providing a compact package design.

It should now be understood that the MIO bonding layers and internal cooling structures incorporated into the power electronics assemblies and vehicles described herein may be utilized to cool semiconductor devices, thereby providing for a more compact cooler package design.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "lower", "upper" and "middle" are used in relation to the figures and are not meant to define an exact orientation of 2-in-1 power electronics assemblies or layers used to form 2-in-1 electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A 2-in-1 power electronics assembly comprising:
 a frame comprising a lower dielectric layer, an upper dielectric layer spaced apart from the lower dielectric layer, and a sidewall disposed between and coupled to the lower dielectric layer and the upper dielectric layer, wherein the lower dielectric layer comprises a lower cooling fluid inlet and the upper dielectric layer comprises an upper cooling fluid outlet;
 a first semiconductor device assembly disposed within the frame and comprising a first semiconductor device disposed between a first lower MIO layer and a first upper MIO layer;
 a second semiconductor device assembly disposed within the frame and comprising a second semiconductor device disposed between a second lower MIO layer and a second upper MIO layer, wherein the second semiconductor device is spaced apart from the first semiconductor device assembly;

a middle dielectric layer positioned between the upper dielectric layer, the lower dielectric layer, the first semiconductor device assembly, and the second semiconductor device assembly;
a lower fluid chamber disposed between the lower dielectric layer, the middle dielectric layer, the first semiconductor device assembly and the second semiconductor device assembly; and
an upper fluid chamber disposed between the upper dielectric layer, the middle dielectric layer, the first semiconductor device assembly and the second semiconductor device assembly.

2. The 2-in-1 power electronics assembly of claim 1, wherein the lower dielectric layer further comprises a lower cooling fluid outlet and the upper dielectric layer further comprises an upper cooling fluid inlet.

3. The 2-in-1 power electronics assembly of claim 2, further comprising:
a lower cooling fluid circuit comprising the lower cooling fluid inlet, the second lower MIO layer, the lower fluid chamber, the first lower MIO layer and the lower cooling fluid outlet, wherein the lower cooling fluid circuit is configured for cooling fluid to flow proximate to first surfaces of the first semiconductor device and the second semiconductor device; and
an upper cooling fluid circuit comprising the upper cooling fluid inlet, the first upper MIO layer, the upper fluid chamber, the second upper MIO layer and the upper cooling fluid outlet, wherein the upper cooling fluid circuit is configured for cooling fluid to flow proximate to second surfaces of the first semiconductor device and the second semiconductor device.

4. The 2-in-1 power electronics assembly of claim 2, further comprising a positive electrode disposed between the upper dielectric layer and the first upper MIO layer, a negative electrode disposed between the upper dielectric layer and the second upper MIO layer, and an output electrode disposed between the lower dielectric layer, the first lower MIO layer and the second lower MIO layer, wherein:
the positive electrode is in electrical communication with the first semiconductor device through the first upper MIO layer;
the negative electrode is in electrical communication with the second semiconductor device through the second upper MIO layer; and
the output electrode is in electrical communication with the first semiconductor device and the second semiconductor device through the first lower MIO layer and the second lower MIO layer, respectively.

5. The 2-in-1 power electronics assembly of claim 2, further comprising:
a first isolating MIO layer spaced apart from the first lower MIO layer and disposed between the first semiconductor device and the lower dielectric layer; and
a first gate electrode disposed between the lower dielectric layer and the first isolating MIO layer, wherein the first gate electrode is electrically isolated from an output electrode and in electrical communication with the first semiconductor device through the first isolating MIO layer.

6. The 2-in-1 power electronics assembly of claim 2, further comprising:
a second isolating MIO layer spaced apart from the second upper MIO layer and disposed between the second semiconductor device and the upper dielectric layer; and a second gate electrode disposed between the upper dielectric layer and the second isolating MIO layer, wherein the second gate electrode is electrically isolated from a negative electrode and in electrical communication with the second semiconductor device through the second isolating MIO layer.

7. The 2-in-1 power electronics assembly of claim 1, wherein:
the lower cooling fluid inlet of the lower dielectric layer comprises a first lower cooling fluid inlet and a second lower cooling fluid inlet;
the upper cooling fluid outlet of the upper dielectric layer comprises a first upper cooling fluid outlet and a second upper cooling fluid outlet; and
a fluid path extends through the middle dielectric layer between the lower fluid chamber and the upper fluid chamber.

8. The 2-in-1 power electronics of claim 7, wherein the fluid path comprises an MIO column extending through the middle dielectric layer.

9. The 2-in-1 power electronics of claim 7, wherein the fluid path comprises at least one metal through hole via extending through the middle dielectric layer.

10. The 2-in-1 power electronics of claim 7, further comprising a cooling fluid circuit configured for cooling fluid to flow proximate to surfaces of the first semiconductor device and the second semiconductor device, the cooling fluid circuit comprising the first and second lower cooling fluid inlets, the lower fluid chamber, the first and second lower MIO layers, the fluid path extending through the middle dielectric layer, the upper fluid chamber, the first and second upper MIO layers, and the first and second upper cooling fluid outlets.

11. The 2-in-1 power electronics of claim 10 wherein:
a first portion of the cooling fluid circuit comprises a first fluid flow path of: first lower cooling fluid inlet—first lower MIO layer—lower fluid chamber—fluid path—first upper MIO layer—first upper cooling fluid outlet; and
a second portion of the cooling fluid circuit comprises a second fluid flow path of: second lower cooling fluid inlet—second lower CIO layer—fluid path—upper fluid chamber—second upper MIO layer—second upper cooling fluid outlet.

12. The 2-in-1 power electronics of claim 7, further comprising a positive electrode disposed between the lower dielectric layer and the first lower MIO layer, a negative electrode disposed between the upper dielectric layer and the second upper MIO layer, a first output electrode disposed between the upper dielectric layer and the first upper MIO layer, and a second output electrode disposed between the lower dielectric layer and the second lower MIO layer, wherein the positive electrode is in electrical communication with the first semiconductor device through the first lower MIO layer, the negative electrode is in electrical communication with the first semiconductor device through the second upper MIO layer, the first output electrode is in electrical communication with the first semiconductor device through the first upper MIO layer, and the second output electrode is in electrical communication with the second semiconductor device through the second lower MIO layer.

13. A 2-in-1 power electronics assembly comprising:
a lower dielectric layer comprising a lower cooling fluid inlet and a lower cooling fluid outlet;

an upper dielectric layer spaced apart from the lower dielectric layer and comprising an upper cooling fluid inlet and an upper cooling fluid outlet;

a middle dielectric layer positioned between and spaced apart from the lower dielectric layer and the upper dielectric layer;

a first semiconductor device assembly comprising a first semiconductor device disposed between a first lower MIO layer and a first upper MIO layer;

a second semiconductor device assembly spaced apart from the first semiconductor device assembly and comprising a second semiconductor device disposed between a second lower MIO layer and a second upper MIO layer;

a lower fluid chamber disposed between the lower dielectric layer, the middle dielectric layer, the first semiconductor device assembly, and the second semiconductor device assembly; and an upper fluid chamber disposed between the middle dielectric layer, the upper dielectric layer, the first semiconductor device assembly, and the second semiconductor device assembly, wherein:

the first semiconductor device assembly and the second semiconductor device assembly are disposed between the lower dielectric layer and the upper dielectric layer; and the middle dielectric layer is positioned between the first semiconductor device assembly and the second semiconductor device assembly.

14. The 2-in-1 power electronics assembly of claim 13, further comprising:

a lower cooling fluid circuit comprising a lower cooling fluid path of: lower cooling fluid inlet—second lower MIO layer—lower fluid chamber—first lower MIO layer—lower cooling fluid outlet; and an upper cooling fluid circuit comprising an upper cooling fluid path of: upper cooling fluid inlet—first upper MIO layer—upper fluid chamber—second upper MIO layer—upper cooling fluid outlet.

15. The 2-in-1 power electronics assembly of claim 13, further comprising a positive electrode disposed between the upper dielectric layer and the first upper MIO layer, a negative electrode disposed between the upper dielectric layer and the second upper MIO layer, and an output electrode disposed between the lower dielectric layer, the first lower MIO layer and the second lower MIO layer, wherein:

the positive electrode is in electrical communication with the first semiconductor device through the first upper MIO layer;

the negative electrode is in electrical communication with the second semiconductor device through the second upper MIO layer; and the output electrode is in electrical communication with the first semiconductor device and the second semiconductor device through the first lower MIO layer and the second lower MIO layer, respectively.

16. The 2-in-1 power electronics assembly of claim 15, further comprising:

a first isolating MIO layer spaced apart from the first lower MIO layer and disposed between the first semiconductor device and the lower dielectric layer;

a first gate electrode disposed between the lower dielectric layer and the first isolating MIO layer, wherein the first gate electrode is electrically isolated from the output electrode and in electrical communication with the first semiconductor device through the first isolating MIO layer;

a second isolating MIO layer spaced apart from the second upper MIO layer and disposed between the second semiconductor device and the upper dielectric layer; and a second gate electrode disposed between the upper dielectric layer and the second isolating MIO layer, wherein the second gate electrode is electrically isolated from the negative electrode and in electrical communication with the second semiconductor device through the second isolating MIO layer.

17. A 2-in-1 power electronics assembly comprising:

a lower dielectric layer comprising a first lower cooling fluid inlet and a second lower cooling fluid inlet;

an upper dielectric layer spaced apart from the lower dielectric layer and comprising a first upper cooling fluid outlet and a second cooling fluid outlet;

a middle dielectric layer positioned between and spaced apart from the lower dielectric layer and the upper dielectric layer;

a fluid path extending through the middle dielectric layer;

a first semiconductor device assembly comprising a first semiconductor device disposed between a first lower MIO layer and a first upper MIO layer;

a second semiconductor device assembly spaced apart from the first semiconductor device assembly and comprising a second semiconductor device disposed between a second lower MIO layer and a second upper MIO layer;

a lower fluid chamber disposed between the lower dielectric layer and the middle dielectric layer; and an upper fluid chamber disposed between the middle dielectric layer and the upper dielectric layer, wherein:

the first semiconductor device assembly and the second semiconductor device assembly are disposed between the lower dielectric layer and the upper dielectric layer; and the middle dielectric layer is positioned between the first semiconductor device assembly and the second semiconductor device assembly.

18. The 2-in-1 power electronics of claim 17 wherein:

a first portion of a cooling fluid circuit comprises a first fluid flow path of: first lower cooling fluid inlet—first lower CIO layer—lower fluid chamber—fluid path—first upper MIO layer—first upper cooling fluid outlet; and a second portion of the cooling fluid circuit comprises a second fluid flow path of: second lower cooling fluid inlet—second lower CIO layer—fluid path—upper fluid chamber—second upper MIO layer—second upper cooling fluid outlet.

19. The 2-in-1 power electronics of claim 17, further comprising a positive electrode disposed between the lower dielectric layer and the first lower MIO layer, a negative electrode disposed between the upper dielectric layer and the second upper MIO layer, a first output electrode disposed between the upper dielectric layer and the first upper MIO layer, and a second output electrode disposed between the lower dielectric layer and the second lower MIO layer, wherein:

the positive electrode is in electrical communication with the first semiconductor device through the first lower MIO layer;

the negative electrode is in electrical communication with the second semiconductor device through the second upper MIO layer;
the first output electrode is in electrical communication with the first semiconductor device through the first upper MIO layer; and
the second output electrode is in electrical communication with the second semiconductor device through the second lower MIO layer.

20. The 2-in-1 power electronics assembly of claim 19, further comprising:
a first isolating MIO layer spaced apart from the first upper MIO layer and disposed between the first semiconductor device and the upper dielectric layer;
a first gate electrode disposed between the upper dielectric layer and the first isolating MIO layer, wherein the first gate electrode is electrically isolated from the first output electrode and in electrical communication with the first semiconductor device through the first isolating MIO layer;
a second isolating MIO layer spaced apart from the second upper MIO layer and disposed between the second semiconductor device and the upper dielectric layer; and
a second gate electrode disposed between the upper dielectric layer and the second isolating MIO layer, wherein the second gate electrode is electrically isolated from the negative electrode and in electrical communication with the second semiconductor device through the second isolating MIO layer.

* * * * *